United States Patent
Nakazawa et al.

(10) Patent No.: US 9,474,166 B2
(45) Date of Patent: Oct. 18, 2016

(54) PRINTED WIRING BOARD, PRINTED CIRCUIT BOARD, AND METHOD FOR MANUFACTURING PRINTED CIRCUIT BOARD

(71) Applicant: CANON KABUSHIKI KAISHA, Tokyo (JP)

(72) Inventors: Keigo Nakazawa, Musashino (JP); Makoto Ito, Sawa-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 362 days.

(21) Appl. No.: 14/103,608

(22) Filed: Dec. 11, 2013

(65) Prior Publication Data

US 2014/0174795 A1    Jun. 26, 2014

(30) Foreign Application Priority Data

Dec. 21, 2012  (JP) .................................. 2012-279564
Jul. 18, 2013   (JP) .................................. 2013-149064

(51) Int. Cl.
H05K 1/00    (2006.01)
H05K 3/34    (2006.01)
H05K 1/02    (2006.01)

(52) U.S. Cl.
CPC .......... H05K 3/3494 (2013.01); H05K 1/0206 (2013.01); H05K 1/0209 (2013.01);
(Continued)

(58) Field of Classification Search
CPC .. H05K 1/0206; H05K 1/021; H05K 1/0201; H05K 3/3494; H05K 3/3452; H05K 1/203; H05K 1/204; H05K 1/206; H05K 1/207
USPC ............. 174/252; 361/679.54, 720, 719, 704
See application file for complete search history.

(56) References Cited

U.S. PATENT DOCUMENTS 5,390,078 A * 2/1995 Taylor ................... H05K 1/141
                                                                165/80.3
5,500,785 A * 3/1996 Funada ............... H01L 23/3677
                                                                174/252

(Continued)

FOREIGN PATENT DOCUMENTS

CN    101420819 A    4/2009
JP    H06-252285 A    9/1994

(Continued)

OTHER PUBLICATIONS

Chinese office Action dated May 20, 2016 in Chinese Application No. 201310692958.7.

*Primary Examiner* — Steven T Sawyer
(74) *Attorney, Agent, or Firm* — Fitzpatrick, Cella, Harper & Scinto

(57) ABSTRACT

A printed wiring board has a heat transfer pattern facing a heat sink of an electronic component, on a first surface layer on which the electronic component having the heat sink is mounted. The printed wiring board has a through hole conductor formed in a through hole penetrating the printed wiring board corresponding to the heat transfer pattern, and thermally connected to the heat transfer pattern. The heat transfer pattern has a plurality of connecting lands exposed so as to be connectable to the heat sink of the electronic component by solder while being divided by a solder resist. The plurality of the connecting lands include lands adjacent to the through holes, and lands not adjacent to the through holes. The heat dissipation of the electronic component is enhanced while enhancing the connectability of the heat transfer pattern with the heat sink of the electronic component, at being mounted.

18 Claims, 12 Drawing Sheets

(52) U.S. Cl.
CPC ..... *H05K3/3452* (2013.01); *H01L 2924/0002* (2013.01); *H05K 3/3421* (2013.01); *H05K 2201/099* (2013.01); *H05K 2201/09572* (2013.01); *H05K 2201/09618* (2013.01); *H05K 2201/09781* (2013.01); *H05K 2201/10969* (2013.01); *H05K 2203/042* (2013.01); *H05K 2203/0465* (2013.01); *Y10T 29/49144* (2015.01)

(56) References Cited

U.S. PATENT DOCUMENTS

| | | | | |
|---|---|---|---|---|
| 5,756,380 | A | * | 5/1998 | Berg ............... H01L 23/3128 438/125 |
| 6,441,312 | B1 | | 8/2002 | Tanimura et al. |
| 6,671,176 | B1 | * | 12/2003 | Barcley ............ H01L 23/3677 165/185 |
| 7,188,338 | B2 | | 3/2007 | Ito |
| 2002/0172025 | A1 | * | 11/2002 | Megahed ........... H01L 23/3677 361/767 |
| 2009/0101395 | A1 | * | 4/2009 | Horikiri ............... H05K 3/341 174/255 |
| 2009/0115050 | A1 | * | 5/2009 | Kasuya ............. H01L 23/3677 257/701 |
| 2012/0181067 | A1 | * | 7/2012 | Wen .................... H05K 1/0206 174/252 |

FOREIGN PATENT DOCUMENTS

| | | |
|---|---|---|
| JP | 2002-026468 A | 1/2002 |
| JP | 3-639505 B | 4/2005 |
| JP | 2006-303392 A | 11/2006 |

\* cited by examiner

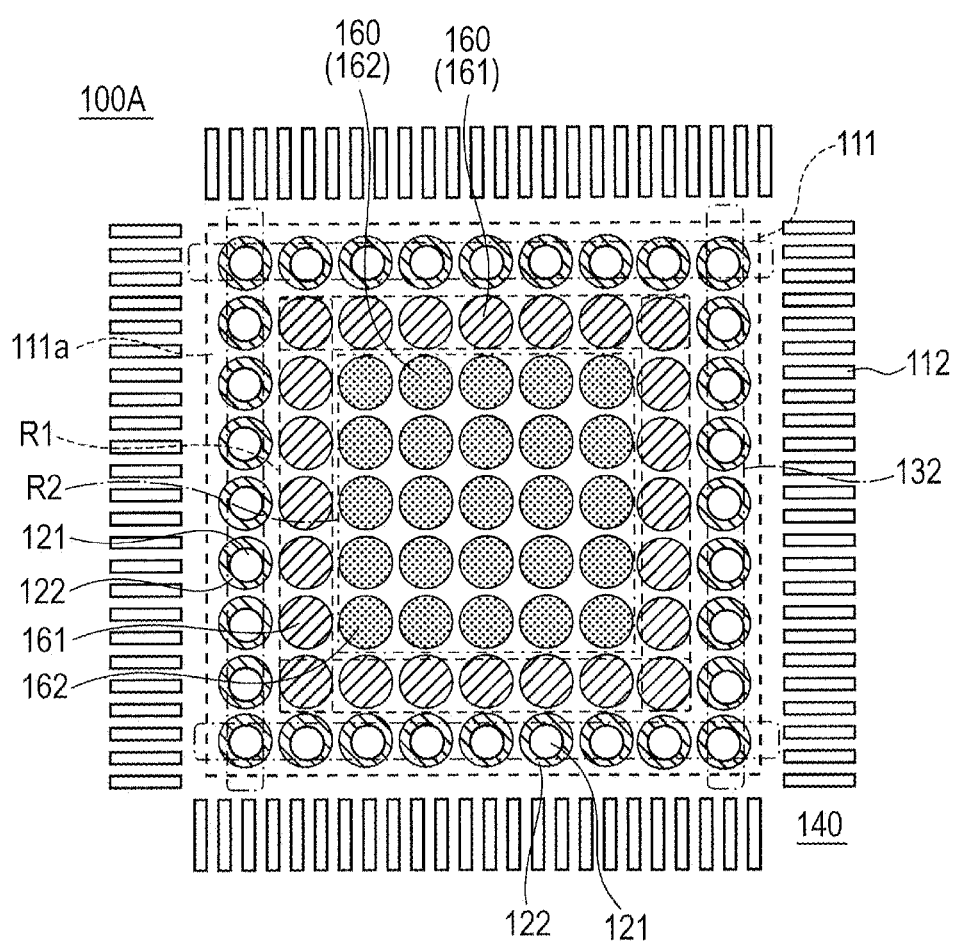

PRINTED WIRING BOARD, PRINTED CIRCUIT BOARD, AND METHOD FOR MANUFACTURING PRINTED CIRCUIT BOARD

BACKGROUND OF THE INVENTION

1. Field of the Invention

The present invention relates to a printed wiring board on which an electronic component provided with a heat sink is mounted, a printed circuit board provided with the electronic component, and a method for manufacturing a printed circuit board.

2. Description of the Related Art

The electronic component which is mounted on the printed wiring board and has a lead electrode has a heat sink provided on its opposite face to the printed wiring board. In addition, the printed wiring board has a heat transfer pattern formed on its opposite face to the electronic component. The heat sink of the electronic component and the heat transfer pattern of the printed wiring board are connected by a solder paste or the like.

On the other hand, in the case of an electronic component which is provided with a heat sink and is manufactured according to a standard of a conventional lead frame (semiconductor package of QFP type, SOP type and the like), a gap (stand-off) is formed between a bottom face of the lead electrode and a bottom face of the heat sink of the electronic component. Generally, the stand-off is set at 100±50 μm according to a package standard of JEDEC and the like.

This electronic component provided with the heat sink is often used for a component with a narrow pitch, which has a pitch of 0.4 mm or the like between leads. Accordingly, in order to prevent a bridge between the leads, it is necessary to decrease the thickness of the solder paste as thin as possible which connects the heat sink of the electronic component to the heat transfer pattern of the printed wiring board. As a result, the value of the stand-off of the electronic component varies because of a tolerance in manufacture. When the value of the stand-off becomes equal to or thicker than the thickness of the solder paste in particular, non-connection has occasionally occurred between the heat sink of the electronic component and the heat transfer pattern of the printed wiring board. In addition, when the solder paste is printed, the solder paste results in being scraped by a squeegee. Accordingly, dispersion occurs also in a print volume of the solder paste, and non-connection has occasionally occurred between the heat sink of the electronic component and the heat transfer pattern of the printed wiring board.

Then, a technology of dividing a heat transfer pattern with a solder resist is described in Japanese Patent Application Laid-Open No. 2006-303392. The technology in Japanese Patent Application Laid-Open No. 2006-303392 includes applying the solder paste onto the whole face of the heat transfer pattern, using such a cohesive effect that the solder paste in a portion on the solder resist moves to an exposed portion of the heat transfer pattern and rises due to the surface tension when the solder paste is fused, and thereby suppressing the poor connection.

In addition, Japanese Patent No. 3639505 describes a technology of radiating heat to a conductor which is arranged on an inner layer or a surface layer at an opposite side of a surface layer on which the electronic component is mounted, through a through hole. In order to prevent fused solder from flowing into the through hole, the technology in Japanese Patent No. 3639505 tries to provide the through hole in a portion of a solder resist, and to print the solder paste only on a solder area in which a heat transfer pattern is exposed while avoiding the portion of the solder resist.

However, the technology in Japanese Patent Application Laid-Open No. 2006-303392 does not have a through hole for releasing the heat of the electronic component to the printed wiring board, and accordingly does not show a sufficient heat dissipation effect.

In addition, in Japanese Patent No. 3639505, the solder paste is printed only on the solder area, and accordingly there is not such a cohesive effect that the solder rises due to the surface tension when having been fused. In other words, it is likely that non-connection occurs between the heat sink of the electronic component and the heat transfer pattern of the printed wiring board, in an electronic component having a large stand-off because of the dispersion in values of the stand-off.

Accordingly, the present invention provides a printed wiring board which can enhance the heat dissipation of the electronic component while enhancing the connectability of the heat transfer pattern with the heat sink of the electronic component, when the electronic component having the heat sink is mounted thereon; a printed circuit board; and a method for manufacturing a printed circuit board.

SUMMARY OF THE INVENTION

According to an aspect of the present invention, a printed wiring board comprises: a first surface layer on which an electronic component is to be mounted, wherein a heat transfer pattern is formed in an area of the first surface on which the electronic component is to be mounted; a second surface layer positioned on a side of the printed wiring board, opposite to the first surface layer; and a through hole penetrating the printed wiring board in a thickness direction thereof, wherein the through hole is formed in the area in which the heat transfer pattern is formed, the heat transfer pattern and a through hole conductor thermally connected to the conductive pattern are formed within the through hole, wherein the heat transfer pattern is covered with a solder resist, and is exposed from the solder resist to form a plurality of connecting lands, and wherein the plurality of connecting lands comprises a first land group including a plurality of first lands, and a second land group including a plurality of second lands, each of the first lands is arranged adjacent to the through hole, and the each of the second lands is not arranged adjacent to the through hole.

Further features of the present invention will become apparent from the following description of exemplary embodiments with reference to the attached drawings.

BRIEF DESCRIPTION OF THE DRAWINGS

FIG. 6 is a plan view illustrating a printed wiring board according to a third embodiment.

DESCRIPTION OF THE EMBODIMENTS

Preferred embodiments of the present invention will now be described in detail in accordance with the accompanying drawings.

[First Embodiment]

Figure 1A:
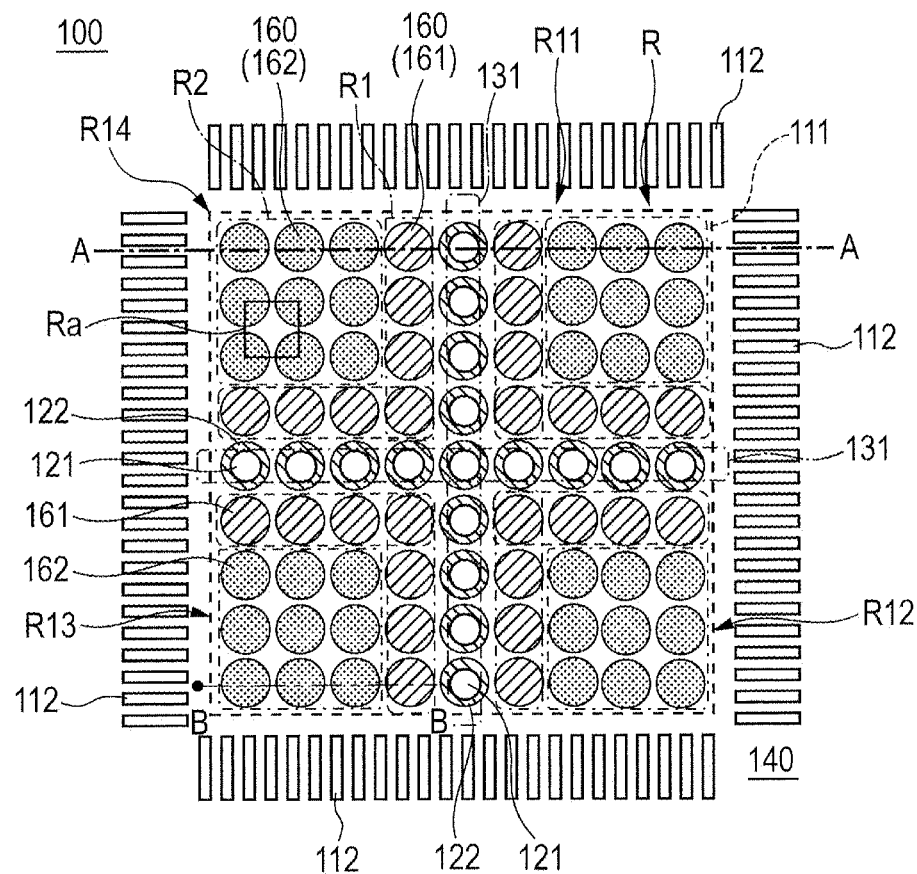
FIGS. 1A and 1B are explanatory views illustrating a schematic configuration of a printed circuit board according to a first embodiment.
Figure 1B:
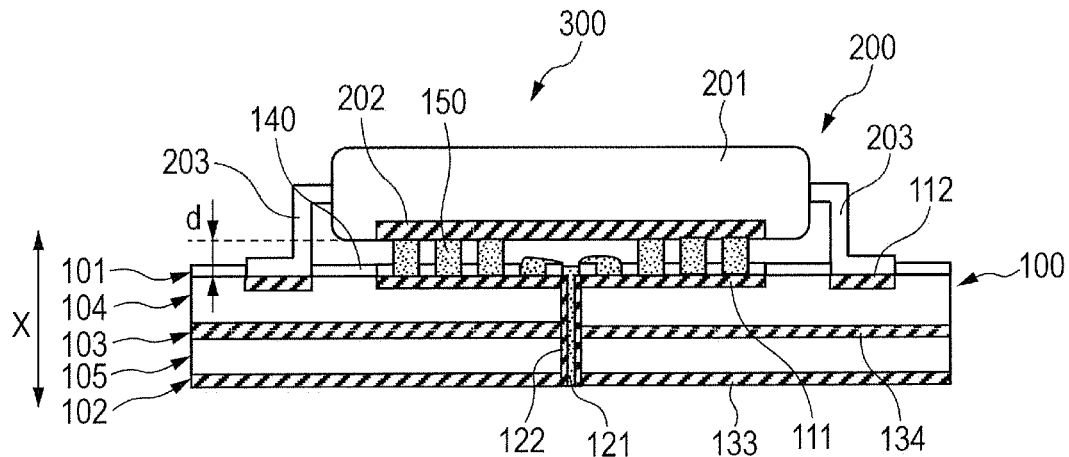

FIGS. 1A and 1B are explanatory views illustrating a schematic configuration of a printed circuit board according to a first embodiment of the present invention. FIG. 1A is a plan view illustrating a portion in the printed wiring board, on which an electronic component is mounted; and FIG. 1B is a sectional view of the printed circuit board taken along the line A-A in FIG. 1A. A printed circuit board 300 includes a semiconductor package 200 which functions as the electronic component, and a printed wiring board 100. The semiconductor package 200 is mounted on the printed wiring board 100.

The semiconductor package 200 is a semiconductor package of QFP (Quad Flat Package) type. The semiconductor package 200 includes a quadrangular (rectangular parallelepiped) package body 201, a quadrangular heat sink 202 provided on the rear face (bottom face) of the package body 201, and a plurality of leads (electrodes) 203 which project from the package body 201. The package body 201 and the heat sink 202 have square shapes.

The printed wiring board 100 is a printed wiring board having a three-layer structure in which a surface layer 101 that is a first surface layer, a surface layer 102 that is a second surface layer positioned on a side of the printed wiring board 100, opposite to the first surface layer 101, and an inner layer 103 between the surface layer 101 and the surface layer 102 are stacked through dielectric layers 104 and 105. The surface layers 101 and 102 and the inner layer 103 are conductor layers on which conductive patterns are arranged. Incidentally, in the first embodiment, the case where the conductor layers are three layers, specifically, the case where the inner layer 103 is one layer will be described below, but there may also be a plurality of layers as the inner layer 103. In addition, the printed wiring board may also be a two-layer structure which has no inner layer 103 therein. The printed wiring board may have a plurality of conductor layers therein.

The semiconductor package 200 is mounted on the surface layer 101 of the printed wiring board 100. In other words, the surface layer 101 is a surface on which the semiconductor package 200 is mounted.

The printed wiring board 100 has a heat transfer pattern 111 arranged on a position which faces the heat sink 202 of the semiconductor package 200, on the surface layer 101. The heat transfer pattern 111 is a quadrangular and tabular conductive pattern which has approximately the same shape as that of the heat sink 202 and approximately the same area as that of the heat sink 202. Specifically, the heat transfer pattern 111 is a square-shaped and tabular conductive pattern.

In addition, the printed wiring board 100 has a plurality of lead-connecting lands (lands for electrode) 112 on the surface layer 101, which are arranged on the outer periphery of the heat transfer pattern 111 so as to be spaced to the heat transfer pattern 111, and onto which the leads 203 of the semiconductor package 200 are connected. The plurality of the lead-connecting lands 112 are arranged so as to be spaced to each other. In the first embodiment, the semiconductor package 200 is a QFP type, and accordingly the plurality of the lead-connecting lands 112 are arranged along the four sides of the heat transfer pattern 111. Accordingly, the heat transfer pattern 111 is surrounded by the plurality of the lead-connecting lands 112.

Each of the leads 203 of the semiconductor package 200 is connected to each of the lead-connecting lands 112 with a solder. At this time, the heat sink 202 of the semiconductor package 200 and the heat transfer pattern 111 of the printed wiring board 100 are opposite to each other. There is a stand-off (distance between bottom face of lead 203 and bottom face of heat sink 202) d between the heat sink 202 of the semiconductor package 200 and the heat transfer pattern 111 of the printed wiring board 100, and accordingly the heat sink 202 and the heat transfer pattern 111 do not come in direct contact with each other. Accordingly, a solder 150 which functions as a solder joint portion is provided between the heat sink 202 and the heat transfer pattern 111 so as to thermally connect the heat sink 202 to the heat transfer pattern 111.

In addition, the periphery of the heat sink 202 and the heat transfer pattern 111 results in being surrounded by the leads 203, and accordingly an effect of directly radiating heat to the air is low. Then, in the printed wiring board 100, through holes 121 which penetrate the printed wiring board in a thickness direction X are formed at the position corresponding to the heat transfer pattern 111. Through hole conductors 122 which have been thermally connected to the heat transfer pattern 111 are formed in the through hole 121. In addition, the printed wiring board 100 has a conductive pattern which is arranged on at least one layer out of the surface layer 102 and the inner layer 103, and in the first embodiment, has conductive patterns 133 and 134 which are arranged on the surface layer 102 and the inner layer 103, and are thermally connected to the through hole conductor 122.

The conductive pattern 133 arranged on the surface layer 102 and the conductive pattern 134 arranged on the inner layer 103 are planate conductive patterns, have larger areas than that of the heat transfer pattern 111, and have larger heat capacities than that of the heat transfer pattern 111. Accordingly, by thermally being connected to the conductive patterns 133 and 134 by the through hole conductor 122, the heat transfer pattern 111 can effectively radiate the heat which has been transmitted to the heat transfer pattern 111 through the through hole conductor 122 to the conductive patterns 133 and 134.

In the first embodiment, a plurality of the through holes 121 in which the through hole conductors 122 are arranged are formed so as to be spaced to each other. In addition, the plurality of the through holes 121 are linearly arrayed in a direction along the plane of the heat transfer pattern 111. The plurality of the linearly arrayed through holes 121 form a through hole group 131 which is a first through hole group.

Thus, many through holes 121 are formed, and thereby a heat dissipation effect of the heat transfer pattern 111 is enhanced.

In the first embodiment, a plurality (two) of the through hole groups 131 are arranged so as to cross each other (orthogonal to each other). Furthermore, each of the through hole groups 131 is arranged along a route passing through a center position of the heat transfer pattern 111. Specifically, the through hole groups 131 are arranged on respective lines which link the centers of the two opposite sides of the heat transfer pattern 111, specifically, are arranged in a +shape.

A solder resist 140 is provided on the surface layer 101 so as to protect a not-shown wiring pattern and the like. The solder resist 140 is formed so as to expose the lands for electrode to be connected by solder, and in the first embodiment, is formed so as to expose the lead-connecting lands 112.

The heat transfer pattern 111 has a plurality (64 pieces in FIGS. 1A and 1B) of connecting lands 160 which are exposed so as to be connectable to the heat sink 202 by the solder 150 while being divided by the solder resist 140, and has portions which are covered with the solder resist 140. Each of the connecting lands 160 is formed so as to be spaced to each other. Incidentally, in the heat transfer pattern 111, a portion which is connected to the through hole conductor 122 of the through hole 121(portion through which through hole 121 penetrates) is also exposed while being divided by the solder resist 140.

The plurality of the connecting lands 160 include a first land group which is formed of a plurality of first lands (lands 161) that are adjacent to the through holes 121, and a second land group which is formed of a plurality of second lands (lands 162) that are not adjacent to the through holes 121. FIGS. 1A and 1B illustrate 28 pieces of the lands 161 and 36 pieces of the lands 162. In other words, the heat transfer pattern 111 has the plurality of the lands 161, and has the plurality of the lands 162. The lands 161 are formed in an area (first area) R1, which is adjacent to the through hole group 131, and the lands 162 are formed in an area (second area) R2, which is not adjacent to the through hole group 131. Each of the plurality of the lands 161 is adjacent to at least one of the plurality of the through holes 121, and each of the plurality of the lands 162 is not adjacent to any of the plurality of the through holes 121.

In the first embodiment, the plurality of the connecting lands 160 and the plurality of the through holes 121 are arrayed in a square lattice form on the surface layer 101. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

In addition, in the case of FIGS. 1A and 1B, the land 161 is adjacent directly to the through hole 121, but as for the land 162, the land 161 exists between the land 162 and the through hole 121. In other words, the land 162 is arranged in the side of the land 161, which is opposite to a side in which the through hole 121 is arranged. Thus, the land 161 exists between the through hole 121 and the land 162.

When the printed circuit board 300 is manufactured, a solder paste is collectively printed on the lead-connecting lands 112 and the whole face of the heat transfer pattern 111. Subsequently, the semiconductor package 200 is mounted on the printed wiring board 100. Subsequently, the solder paste is heated to be fused in a reflow step. Thereby, the lead 203 and the lead-connecting land 112 are connected to each other by the solder, and the heat sink 202 and the heat transfer pattern 111 are also connected to each other by the solder 150. At this time, in order to suppress poor connection between the heat sink 202 and the heat transfer pattern 111, the solder resist 140 is formed also on the heat transfer pattern 111, when the solder paste printed on the heat transfer pattern 111 is fused.

The solder paste which has been collectively printed on the heat transfer pattern 111 (solder resist 140) and the lead-connecting lands 112 is fused to cohere on the plurality of the lands 161 and 162, and is cooled to be solidified. It is highly possible that the solder which has been printed on the area (first area) R1 adjacent to the through hole group 131 flows into the through hole 121, as is illustrated in FIG. 1B. On the other hand, the solder which has been printed on the area (second area) R2 that is not adjacent to the through hole group 131 does not flow into the through hole 121. Accordingly, the solder results in entering the inner part of at least one through hole 121 and being solidified in the state.

In the present embodiment, the solder which has been printed on the first area R1is made to positively flow into the through hole 121, which thereby suppresses the flowing of the solder that has been printed on the second area R2 into the through hole 121. Accordingly, when the semiconductor package 200 has been mounted on the printed wiring board 100 and the solder has been solidified, the state is as follows. Specifically, the land 162 arranged in the area (second area) R2 which is not adjacent to the through hole group 131 is connected to the heat sink 202 by the solder 150. On the other hand, at least one (one part) of the lands 161 which have been arranged in the area (first area) R1adjacent to the through hole group 131 is not connected to the heat sink 202 because of the shortage of the solder 150. At this time, the solder is solidified in the state in which the solder has entered the inner part of at least one through hole 121.

The solder which has been printed on the second area R2 does not flow into the through hole 121 and coheres toward the plurality of the lands 162 to be solidified thereon. Thereby, the solder 150 is formed as a plurality of solder joint portions which connect the heat sink 202 with each of the lands 162. The following study has been conducted in order to specify a relationship between the area of the lands 162 and the cohesive effect (height of solder) at that time.

Experimental Example 1

Figure 2A:
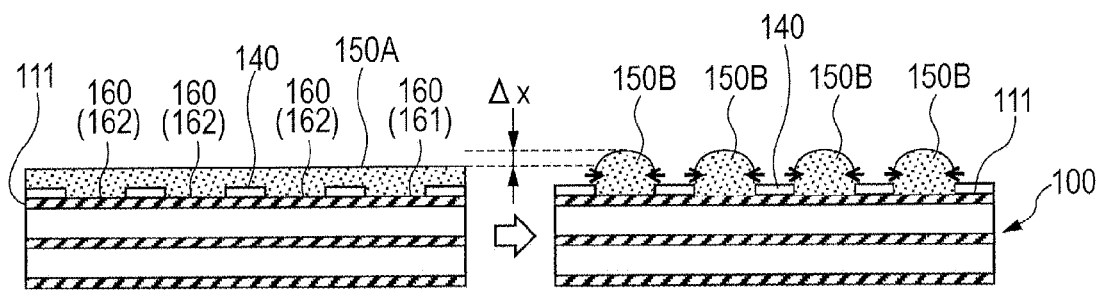
FIGS. 2A and 2B are views for describing a cohesive effect of a solder in a reflow step.
Figure 2B:
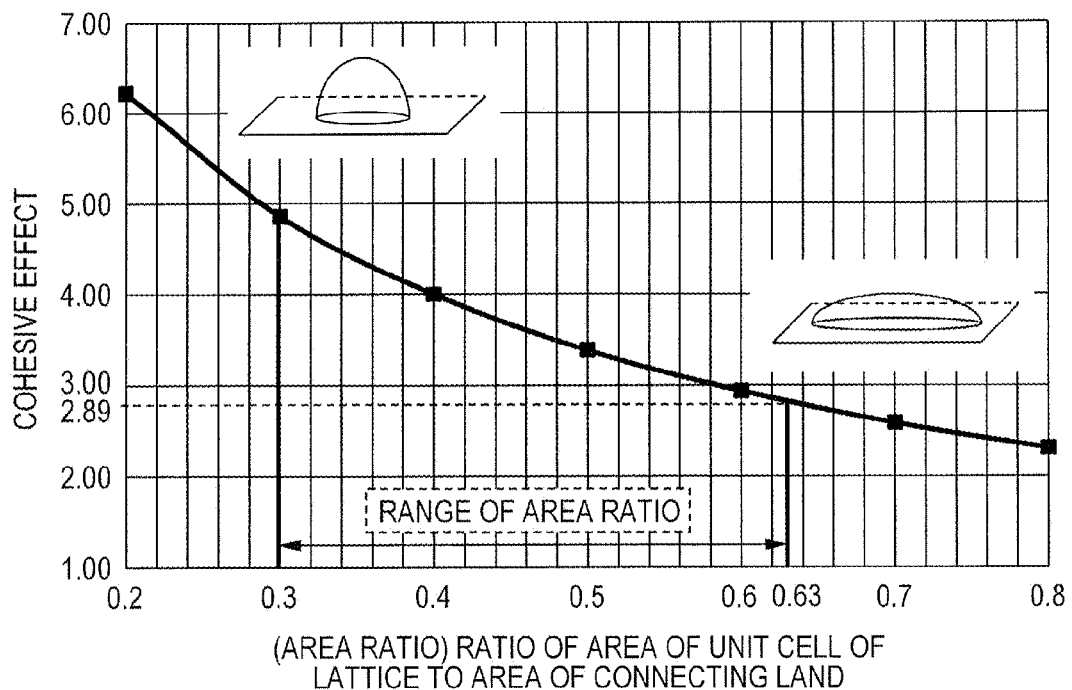

The cohesive effect of the solder in a reflow step will be described below with reference to FIGS. 2A and 2B. FIG. 2A is a sectional view of a printed wiring board taken along the B-B line of FIG. 1A. FIG. 2B is a graph illustrating a relationship between a ratio (area ratio) of the area of the connecting lands with respect to the area of one lattice and a cohesive effect.

As is illustrated in FIG. 2A, a solder paste 150A is uniformly applied onto the heat transfer pattern 111 through the solder resist 140 and is heated. Thereby, the solder paste 150A is fused, and the fused solder 150B coheres on the connecting land 160 due to the surface tension. Due to this cohesive effect, the height of the fused solder 150B increases by $\Delta x$ compared to the height in the state in which the solder paste 150A has been applied. Accordingly, even if there is dispersion in the height between the heat sink 202 of the semiconductor package 200 and the heat transfer pattern 111 of the printed wiring board 100, or in the volume of the solder paste 150A, the connection between the heat sink 202 and the heat transfer pattern 111 can be obtained.

The relationship between the ratio (area ratio) of the area of the connecting land 160 included in an area Ra with respect to the area of one lattice (square area Ra in FIG. 1A) and the cohesive effect is illustrated in FIG. 2B. The cohesive effect which is a vertical axis of FIG. 2B means a ratio of the height of the fused solder 150B formed when the fused solder 150B coheres on the connecting land 160 due to the surface tension with respect to the height of the solder paste 150A except for flux. When the width (area) of the solder resist 140 which divides the connecting land 160 into the plurality has been decreased and the area ratio of the connecting lands 160 with respect to the area Ra has been approached to 1, the amount of the fused solder which coheres on the connecting land 160 decreases, and accordingly a sufficient height of the solder is not obtained. In other words, the cohesive effect decreases. On the contrary, when the width (area) of the solder resist 140 is increased, the cohesive effect increases, and the sufficient height of the solder is obtained. In order to obtain 2.89 times or more of the cohesive effect, the ratio of the area of the connecting lands 160 with respect to that of the area Ra can be set at 30% or more and 63% or less, though the details will be described later. Specifically, the ratio of the area of the lands 162 with respect to the area of the lattice in which the lands 162 are provided can be set at 30% or more and 63% or less. Even when a print volume has been reduced when the solder paste has been printed, sufficient connectability of the heat transfer pattern 111 can be obtained with respect to the semiconductor package 200 having the stand-off of 150 μm.

Next, a reason why the ratio of the area of the connecting lands 160 per one lattice (area Ra) of the square lattice has been set at 30% or more and 63% or less will be described in detail below.

Figure 3:
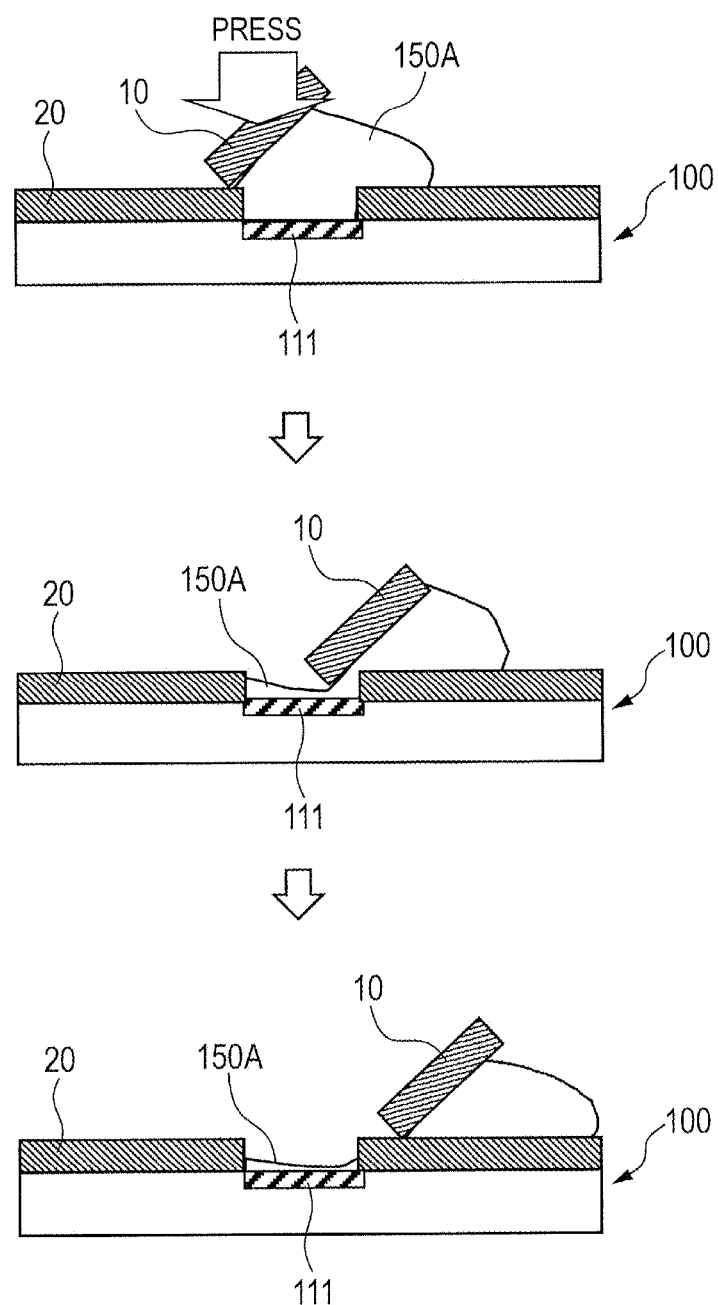
FIG. 3 is an explanatory view illustrating an operation of scraping a solder paste off with a squeegee.

FIG. 3 is an explanatory view illustrating an operation of scraping the solder paste 150A off with a squeegee 10. Incidentally, in FIG. 3, the illustration of the solder resist 140 is omitted. As is illustrated in FIG. 3, a metal mask 20 is arranged on the printed wiring board 100, and the solder paste 150A is printed on the heat transfer pattern 111 with the squeegee 10. At this time, the solder paste 150A is simultaneously printed also on not-shown lead-connecting lands and other lands for the electronic component.

When the solder paste 150A is printed, there is the case where the solder paste 150A is scraped off by the squeegee 10 and the print volume is reduced. The decrease of the print volume occurs generally in a range of 0% to −20%. Even when the print volume has been reduced when this solder paste 150A has been printed, it is important to surely connect the heat sink with the heat transfer pattern according to the package standard (stand-off of 100±50 μm) of JEDEC, which is generally used, and to enhance the joint reliability on that basis.

The lands 162 are arranged so as to have a spacing of 0.25 mm or more from the through hole 121, and accordingly can secure sure connection between the heat sink and the heat transfer pattern, free from the influence of the through hole 121 (flowing of fused solder into through hole 121). In other words, the area ratio of the connecting lands 160 with respect to the area Ra may be set at a value at which the solder can connect the heat sink and the heat transfer pattern having the maximum value of 150 μm of the stand-off, even when the print volume has been reduced when the solder paste 150A has been printed.

Then, firstly, the reason why the ratio of the area of the connecting lands 160 with respect to that of the area Ra is set at 63% or less will be described below. Suppose that the thickness of the solder paste 150A is set at 130 μm so as to prevent a bridge between leads resulting from high packaging density and a reduction rate of the print volume of the solder paste 150A is set at −20% (maximum value of reduction rate). Then, the height of the solder after having been fused is 52 μm except for the flux. This height 52 μm of the solder needs to be increased to 150 μm or more. Accordingly, the cohesive effect needs to be 2.89 times or more.

Specifically, such a ratio of the area of the connecting lands 160 with respect to that of the area Ra that the cohesive effect becomes 2.89 times or more is determined to be 63% or less, from FIG. 2B. In order to prevent the bridge between the leads resulting from the high packaging density, there is the case where the print volume is reduced when the solder paste 150A is printed and the thickness of the solder paste 150A is decreased. Even in such a case, if the ratio is set at 63% or less, the heat sink 202 of the semiconductor package 200 and the heat transfer pattern 111, of which the stand-off is 150 μm, can be surely connected to each other.

Next, the reason why the ratio of the area of the connecting lands 160 with respect to that of the area Ra is set at 30% or more will be described below. When the joint reliability shows a smaller value than 30%, generally, the joint strength between the heat transfer pattern of the printed wiring board and the heat sink of the semiconductor package becomes weak. It is known that because of this, the peeling of the solder occurs in the interface of the joint portion due to the displacement of the component and/or an external force, when the solder paste is fused. In other words, the joint reliability is enhanced by setting the ratio of the area of the connecting lands 160 with respect to that of the area Ra at 30% or more.

From the above reasons, the ratio of the area of the connecting lands 160 with respect to that of the area Ra is set at 30% or more and 63% or less. Thereby, even when the print volume has been reduced when the solder paste is printed, the connectability and the joint reliability with respect to the semiconductor package having the stand-off of 150 μm can be obtained.

At this time, the average joint area of the semiconductor package for the heat sink was 40.1%. Incidentally, when all of the first areas and the second areas except for the through holes are connected to the heat sink of the semiconductor package, the joint area of the semiconductor package for the heat sink is 47.1%. In addition, when all of the lands are in the form of being adjacent to the through hole, most of the solder results in flowing into the through hole, and the joint area of the semiconductor package for the heat sink results in being 20% or less.

In addition, when the through hole group 131 is arrayed linearly or in a combination form of linear arrays, a larger number of lands 162 can be secured which are not adjacent to the through hole 121. Thereby, a larger number of sure connections can be obtained which are little influenced by the through hole 121.

In addition, in the first embodiment, the area R in which a plurality of the connecting lands 160 are arranged is divided into a plurality (four) of divided areas R11, R12, R13 and R14 by the through hole groups 131. The total area of the connecting lands 160 is equal among these four divided areas R11 to R14. In the first embodiment, the number of the connecting lands 160 is equal in each of the divided areas R11 to R14. Specifically, the number of connecting lands 160 is 16 in each of the divided areas R11 to R14. Thereby, the solder 150 in each of the connecting lands 160 can support the semiconductor package 200 with sufficient balance, and can effectively suppress the inclination of the semiconductor package 200.

In particular, in the first embodiment, the connecting lands 160 are arranged so as to form lines in the square lattice form, and accordingly the solder 150 can more effectively support the semiconductor package 200 with sufficient balance.

In addition, the connecting lands 160 and the through holes 121 are arranged to form lines so as to be 90° rotationally symmetric with respect to the center of the heat transfer pattern 111, which can accordingly further effectively suppress the inclination of the semiconductor package 200.

As described above, by having the configuration of the first embodiment, the solder 150 can surely connect the heat sink 202 and the heat transfer pattern 111 to each other, and can effectively transmit the heat to the heat transfer pattern 111. In addition, the heat which has been transmitted to the heat transfer pattern 111 is effectively radiated to the conductive patterns 133 and 134 through the through hole conductor 122 in the through hole 121. In other words, the connectability and the heat dissipation can be enhanced at the same time.

[Second Embodiment]

In the first embodiment illustrated in FIGS. 1A and 1B, the lands 161 are formed in the first area R1 which is adjacent directly to the through hole 121, and the lands 162 are formed in the second area R2, while the lands 161 exist between the second area R2 and the through holes 121. However, as for the second area R2, the lands 161 do not need to exist between the second area R2 and the through holes 121, but a clearance between the through hole 121 and the land 162 may be a value equal to or larger than a specific value.

Figure 4:
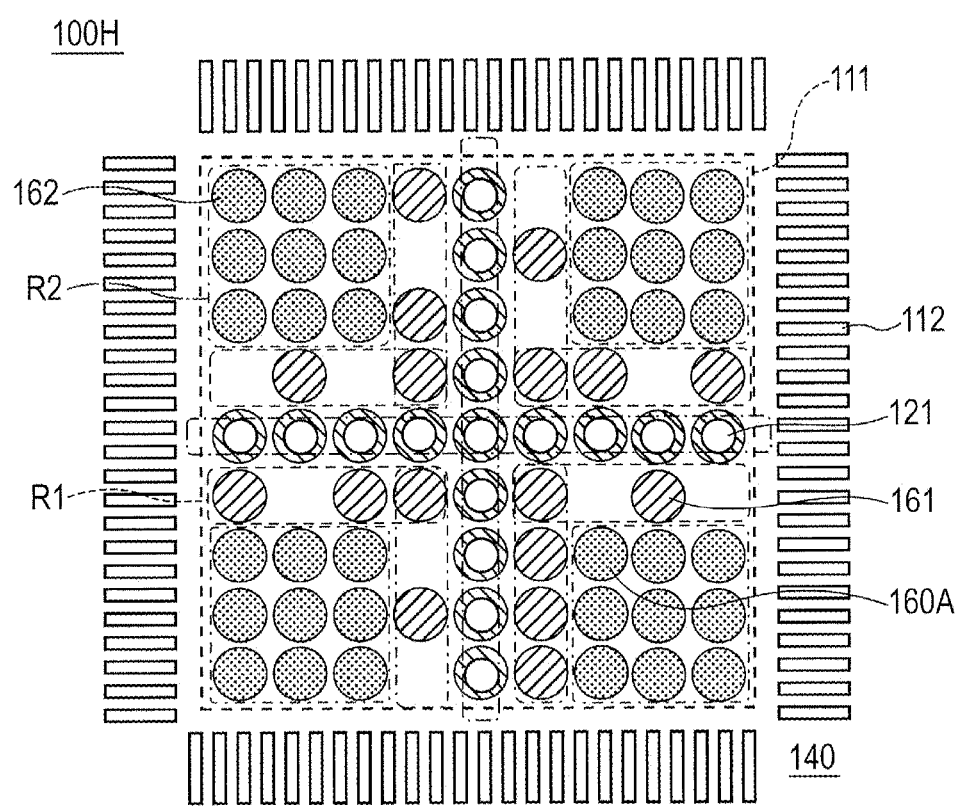
FIG. 4 is a plan view illustrating a printed wiring board according to a second embodiment.

A printed circuit board according to the second embodiment of the present invention will be described below. FIG. 4 is a plan view illustrating a printed wiring board 100H according to the second embodiment. Incidentally, in the second embodiment, the illustration is omitted for an electronic component which is mounted on the printed wiring board, and a solder joint portion which connects a heat sink of the electronic component and a heat transfer pattern of the printed wiring board to each other. In addition, in the printed wiring board 100H of the second embodiment, configurations similar to those in the above described first embodiment are designated by the same reference numerals, and the description will be omitted.

In the second embodiment, the second area R2 is not necessarily determined not to be adjacent to the through holes 121, but may be adjacent to the through holes 121 as long as the second area R2 has a predetermined clearance provided therebetween. For instance, the land 160A arranged in the second area R2 is adjacent to the through hole 121, while being separated therefrom by a space corresponding to one land.

The following experiment was conducted in order to verify a relationship between spacing between the through hole and the land and whether the solder flows into the through hole or not.

Experimental Example 2

Printed wiring boards of 18 pieces were prepared, in each of which through holes and lands were arranged at positions similar to those in the printed wiring board 100 illustrated in FIG. 1A, and the solder paste 150A was printed on both the connecting lands 160 and the solder resists 140. The thickness of the printed wiring board 100 was set at 1.6 mm, and the size of the heat transfer pattern 111 was set at 6.2×6.2 mm. The diameter of the through hole 121 was set at 0.3 mm, and 17 through holes 121 were provided. The diameter of the connecting land 160 was set at 0.6 mm, and 64 connecting lands 160 were provided. The width of the resist was set at 0.1 mm.

The solder paste 150A was printed to have a thickness of 130 μm, and the reduction of a print volume occurred in a range of 0% to −15.4% due to the scraping of the solder paste 150A by the squeegee 10. After that, the solder paste 150A was heated, and the semiconductor package 200 was mounted on the printed wiring board 100. The heat sink 202 of the semiconductor package 200 had a size of 6.2×6.2 mm which was the same size as that of the heat transfer pattern 111, and a stand-off d was 100±50 μm.

Printed wiring boards were prepared in which spacings between the through hole 121 and the connecting land 160 were 0.2 mm, 0.25 mm, 0.4 mm, 0.5 mm, 0.6 mm and 0.7 mm, respectively, and the solder paste 150A was printed on both the connecting lands 160 and the solder resists 140. The thickness of the printed wiring board 100 was set at 1.6 mm, the diameter of the through hole 121 was set at 0.3 mm, and the diameter of the connecting land 160 was set at 0.6 mm. The state of the connection of the heat transfer pattern 111 in the obtained printed circuit board 300 was examined through an X-ray fluoroscope. The result is illustrated in FIGS. 5A to 5C.

Figure 5A:
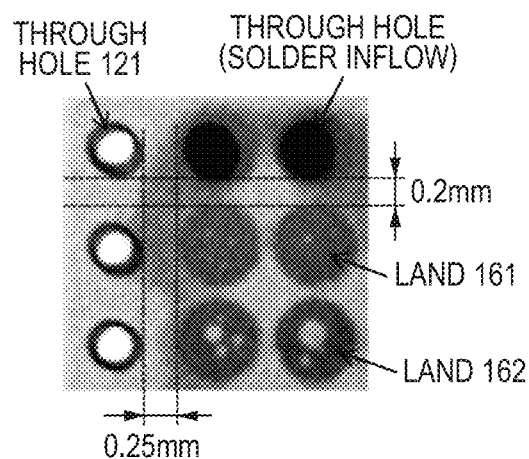
FIGS. 5A, 5B and 5C are views illustrating a state of the connection of a heat transfer pattern of a printed circuit board, which has been looked at through an X-ray fluoroscope.

FIG. 5A is a measurement result when spacings between the through hole 121 and the connecting land 160 were each set at 0.2 mm and 0.25 mm. As is understood from FIG. 5A, when the spacing between the through hole 121 and the land 161 is 0.20 mm, the solder flows into the through hole 121. In addition, when the spacing between the through hole 121 and the land 161 is 0.25 mm, the solder does not flow into the through hole 121.

Figure 5B:
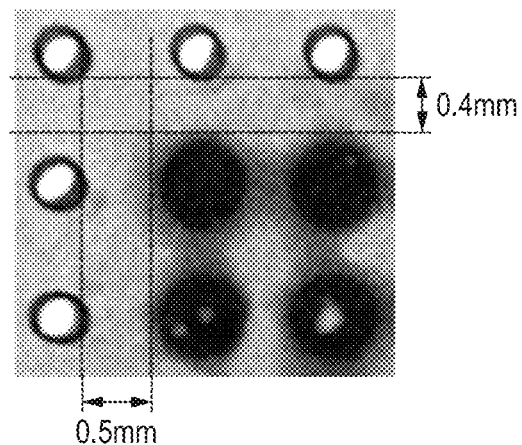

FIG. 5B is a measurement result when the spacings between the through hole 121 and the connecting land 160 were each set at 0.4 mm and 0.5 mm. As is understood from FIG. 5B, when the spacings between the through hole 121 and the land 161 are each 0.4 mm and 0.5 mm, the solder does not flow into the through hole 121.

Figure 5C:
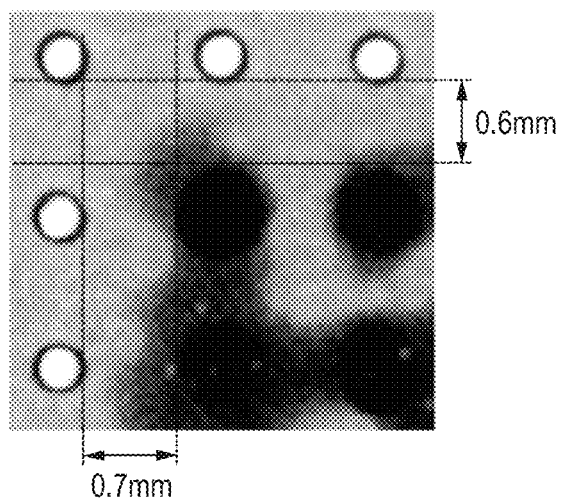

FIG. 5C is a measurement result when the spacings between the through hole 121 and the connecting land 160 were each set at 0.6 mm and 0.7 mm. As is understood from FIG. 5C, when the spacings between the through hole 121 and the land 161 are each 0.6 mm and 0.7 mm, the solder does not flow into the through hole 121.

It is understood from the above results that when the spacing between the through hole 121 and the land 162 is set at 0.25 mm or more, sure connection can be secured which is free from the influence of the through hole 121 (flowing of fused solder into through hole 121). It is also understood that when the spacing between the through hole and the land is set at 0.20 mm or less, the solder can be made to flow into the through hole.

Accordingly, in the first area R1 in which the solder flows into the through hole, the spacing between the through hole and the land can be set at 0.20 mm or less. In addition, in the second area R2 in which the solder does not flow into the through hole, the spacing between the through hole and the land can be set at 0.25 mm or more.

[Third Embodiment]

Next, a printed circuit board according to a third embodiment of the present invention will be described below. FIG. 6 is a plan view illustrating a printed wiring board 100A according to the third embodiment of the present invention.

Incidentally, in the third embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

Also in the third embodiment, the electronic component is a semiconductor package of QFP type having a similar configuration to that of the semiconductor package 200 in the above described first embodiment, and is mounted on the first surface layer of the printed wiring board 100A of the second embodiment.

In the third embodiment, the configurations of the through hole 121 and the connecting land 160 are similar to those in the above described first embodiment, but the arrangements are different from those in the above described first embodiment.

In the third embodiment, a plurality of the connecting lands 160 and a plurality of the through holes 121 are arrayed in a square lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

At least one part out of the plurality of the through holes 121 (all through holes in third embodiment) is arrayed along a circumferential part 111a of the heat transfer pattern 111, and constitutes a through hole group 132 which surrounds the plurality of the connecting lands 160 and is a second through hole group. Specifically, the through hole group 132 which includes a plurality of the arrayed through holes 121 forms a quadrangular shape, and the through holes 121 are linearly arrayed in each side. In other words, a plurality (four) of the linear through hole groups are arranged so as to cross each other on the circumferential part 111a, and form the through hole group 132. Thus, many through holes 121 are formed, and thereby a heat dissipation effect of the heat transfer pattern 111 is enhanced.

Out of a plurality of the connecting lands 160, a plurality of the lands 162 are arranged in an inner periphery side, and a plurality of the lands 161 are arranged on the outer periphery of the plurality of the lands 162. The through hole group 132 is arranged on the outer periphery of the plurality of the connecting lands 160 (on outer periphery of plurality of lands 161).

The solder paste is applied onto the heat transfer pattern 111 through the solder resist 140. Even when the solder is about to overflow when having been fused in a reflow step, the through hole 121 can make the solder flow thereinto, which accordingly can suppress the spillage of the solder to the outside of the heat transfer pattern 111, specifically, can suppress the outflow of the solder to the lead-connecting land 112.

In addition, the connecting lands 160 and the through holes 121 are arranged in a square lattice form to form lines. Accordingly, the solder in each of the connecting lands 160 can support the semiconductor package with sufficient balance, and can effectively suppress the inclination of the semiconductor package.

In addition, the connecting lands 160 and the through holes 121 are arranged to form lines so as to be 90° rotationally symmetric with respect to the center of the heat transfer pattern 111, which can accordingly further effectively suppress the inclination of the semiconductor package.

[Fourth Embodiment]

Figure 7:
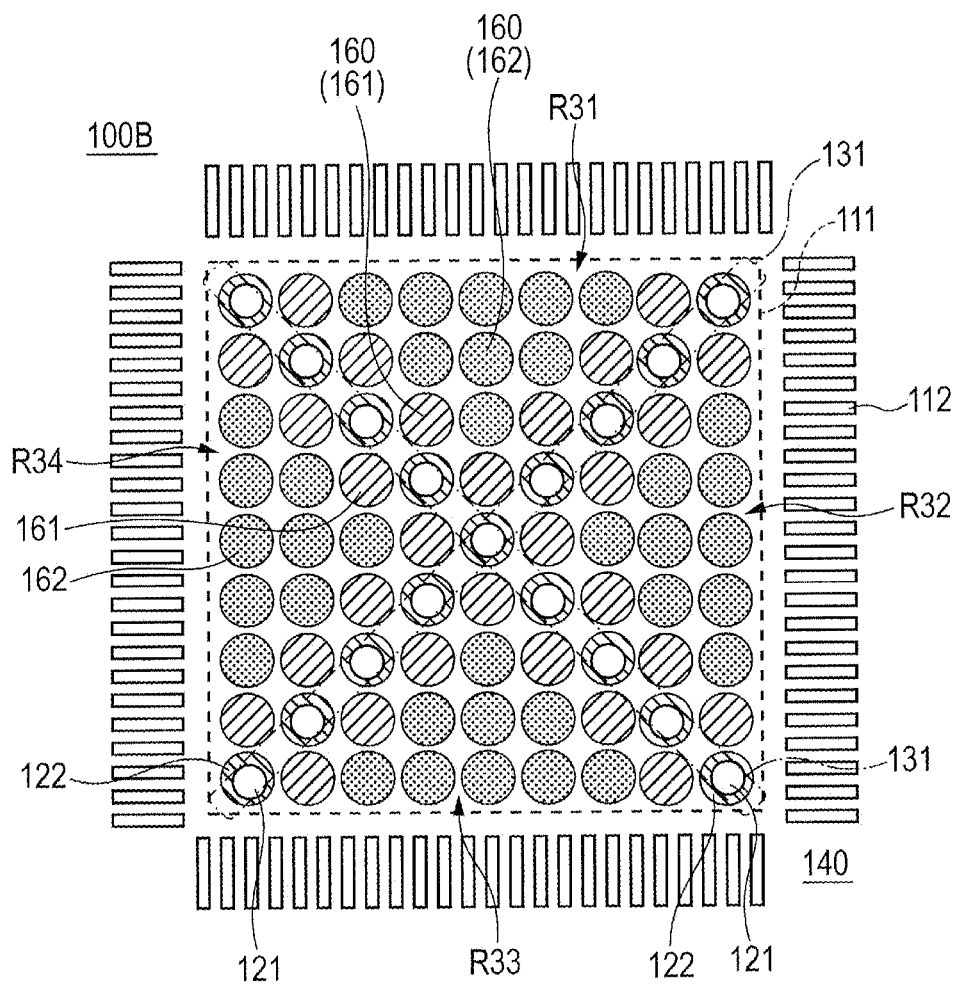
FIG. 7 is a plan view illustrating a printed wiring board according to a fourth embodiment.

Next, a printed circuit board according to a fourth embodiment of the present invention will be described below. FIG. 7 is a plan view illustrating a printed wiring board 100B according to the fourth embodiment of the present invention. Incidentally, in the fourth embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

Also in the fourth embodiment, the electronic component is a semiconductor package of QFP type having a similar configuration to that of the semiconductor package 200 in the above described first embodiment, and is mounted on the first surface layer of the printed wiring board 100B of the fourth embodiment.

In the fourth embodiment, the configurations of the through hole 121 and the connecting land 160 are similar to those in the above described first embodiment, but the arrangements are different from those in the above described first embodiment.

In the fourth embodiment, a plurality of the connecting lands 160 and a plurality of the through holes 121 are arrayed in a square lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

In the fourth embodiment, the plurality of the through holes 121 are linearly arrayed in a direction along the plane of the heat transfer pattern 111. The plurality of the linearly arrayed through holes 121 form a through hole group 131 which is a first through hole group. Thus, many through holes 121 are formed, and thereby a heat dissipation effect of the heat transfer pattern 111 is enhanced.

In the fourth embodiment, a plurality (two) of the through hole groups 131 are arranged so as to cross each other (orthogonal to each other). Furthermore, each of the through hole groups 131 is arranged along a route passing through a center position of the heat transfer pattern 111. Specifically, the through hole groups 131 are arranged on respective lines which link the two opposite corners of the heat transfer pattern 111, specifically, are arranged in an X shape.

In addition, in the fourth embodiment, the area in which the plurality of the connecting lands 160 are arranged is divided into a plurality (four) of divided areas R31, R32, R33 and R34 by the through hole groups 131. The total area of the connecting lands 160 is equal among these four divided areas R31 to R34. In the fourth embodiment, the number of the connecting lands 160 is equal in each of the divided areas R31 to R34. Thereby, the solder in each of the connecting lands 160 can support the semiconductor package with sufficient balance, and can effectively suppress the inclination of the semiconductor package.

In the fourth embodiment in particular, the connecting lands 160 are arranged so as to form lines in the square lattice form, and accordingly the solder can more effectively support the semiconductor package with sufficient balance.

In addition, the connecting lands 160 and the through holes 121 are arranged to form lines so as to be 90° rotationally symmetric with respect to the center of the heat transfer pattern 111, which can accordingly further effectively suppress the inclination of the semiconductor package.

[Fifth Embodiment]

Figure 8:
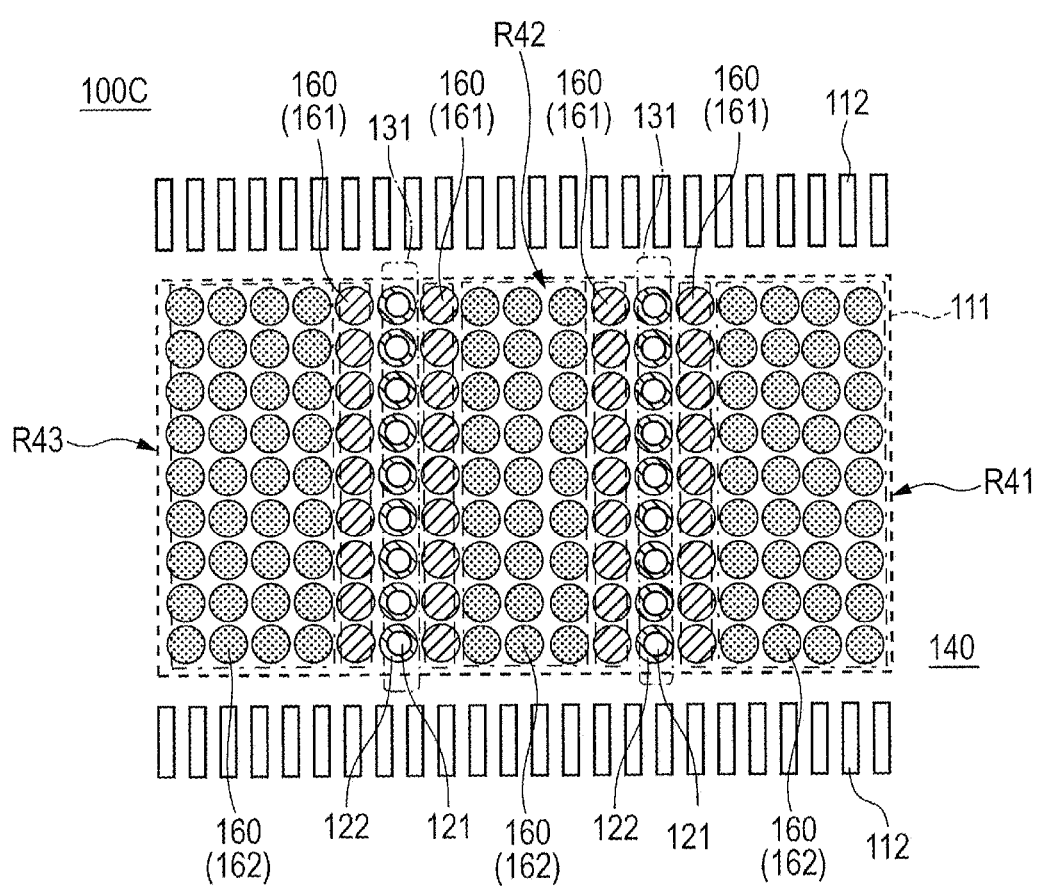
FIG. 8 is a plan view illustrating a printed wiring board according to a fifth embodiment.

Next, a printed circuit board according to a fifth embodiment of the present invention will be described below. FIG. 8 is a plan view illustrating a printed wiring board according to the fifth embodiment of the present invention. Incidentally, in the fifth embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

In the fifth embodiment, the electronic component is a semiconductor package of SOP (Small Outline Package) type and is mounted on the first surface layer of the printed wiring board 100C of the fifth embodiment, but has a different arrangement and configuration of leads from that of the semiconductor package of the QFP type. Accordingly, in the fifth embodiment, the semiconductor package is the SOP type, and accordingly a plurality of lead-connecting lands 112 are arranged along two opposite sides (long sides) of the heat transfer pattern 111. Incidentally, the main body of the semiconductor package of the SOP type has a rectangular shape when viewed as the plane, and accordingly the heat sink also has a rectangular shape when viewed as the plane, and the heat transfer pattern 111 which is opposite to the heat sink also has a rectangular shape when viewed as the plane.

Furthermore, in the fifth embodiment, the configurations of the through hole 121 and the connecting land 160 are similar to those in the above described first embodiment, but the arrangements are different from those in the above described first embodiment.

In the fifth embodiment, a plurality of the connecting lands 160 and a plurality of the through holes 121 are arrayed in a square lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

In the fifth embodiment, the plurality of the through holes 121 are linearly arrayed in a direction along the plane of the heat transfer pattern 111. The plurality of the linearly arrayed through holes 121 form a through hole group 131 which is a first through hole group. Thus, many through holes 121 are formed, and thereby a heat dissipation effect of the heat transfer pattern 111 is enhanced.

In the fifth embodiment, a plurality (two) of the through hole groups 131 are arranged. In addition, the area in which the plurality of the connecting lands 160 are arranged is divided into a plurality (three) of divided areas R41, R42 and R43 by the two through hole groups 131. The total area of the connecting lands 160 is equal among these three divided areas R41 to R43. In the fifth embodiment, the number of the connecting lands 160 is equal in each of the divided areas R41 to R43. Thereby, the solder in each of the connecting lands 160 can support the semiconductor package with sufficient balance, and can effectively suppress the inclination of the semiconductor package.

In the firth embodiment in particular, the connecting lands 160 are arranged so as to form lines in the square lattice form, and accordingly the solder can more effectively support the semiconductor package with sufficient balance.

Sixth Embodiment

Figure 9:
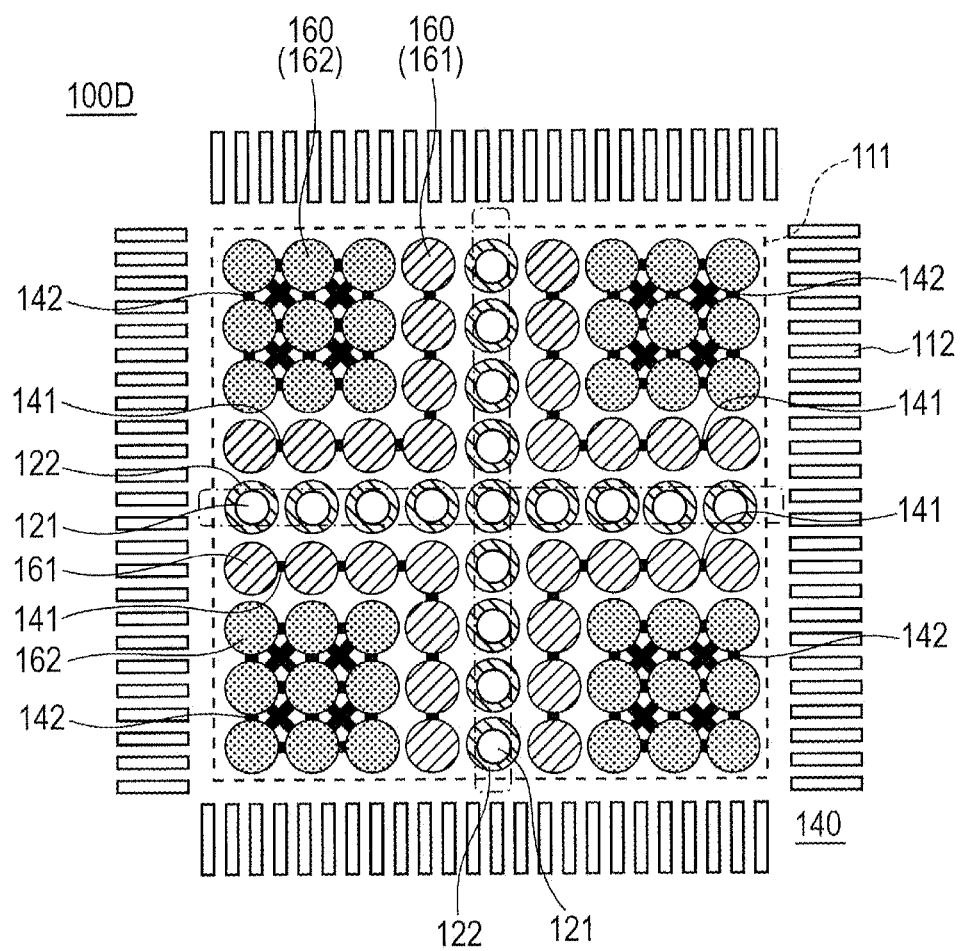
FIG. 9 is a plan view illustrating a printed wiring board according to a sixth embodiment.

Next, a printed circuit board according to a sixth embodiment of the present invention will be described below. FIG. 9 is a plan view illustrating a printed wiring board according to the sixth embodiment of the present invention. Incidentally, in the sixth embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

Also in the sixth embodiment, the electronic component is a semiconductor package of the QFP type having a similar configuration to that of the semiconductor package 200 of the above described first embodiment, and is mounted on the first surface layer of the printed wiring board 100D of the sixth embodiment. In the sixth embodiment, the configurations and the arrangements of the through hole 121 and the connecting land 160 are similar to those in the above described first embodiment.

In the sixth embodiment, adjacent lands 161 of a plurality of lands 161 are mutually connected through a slit 141 formed in the solder resist 140, which is a first slit. Thereby, the height of the solder after having been fused is uniformized among each of the lands 161, the inclination of the semiconductor package can be effectively suppressed, and the decrease of the joint area due to the dispersion in the cohesion of the solder can be effectively suppressed.

Furthermore, in the sixth embodiment, adjacent lands 162 of a plurality of lands 162 are mutually connected through a slit 142 formed on the solder resist 140, which is a second slit. Thereby, the height of the solder after having been fused is uniformized among each of the lands 162, the inclination of the semiconductor package can be effectively suppressed, and the decrease of the joint area due to the dispersion in the cohesion of the solder can be effectively suppressed.

[Seventh Embodiment]

Figure 10:
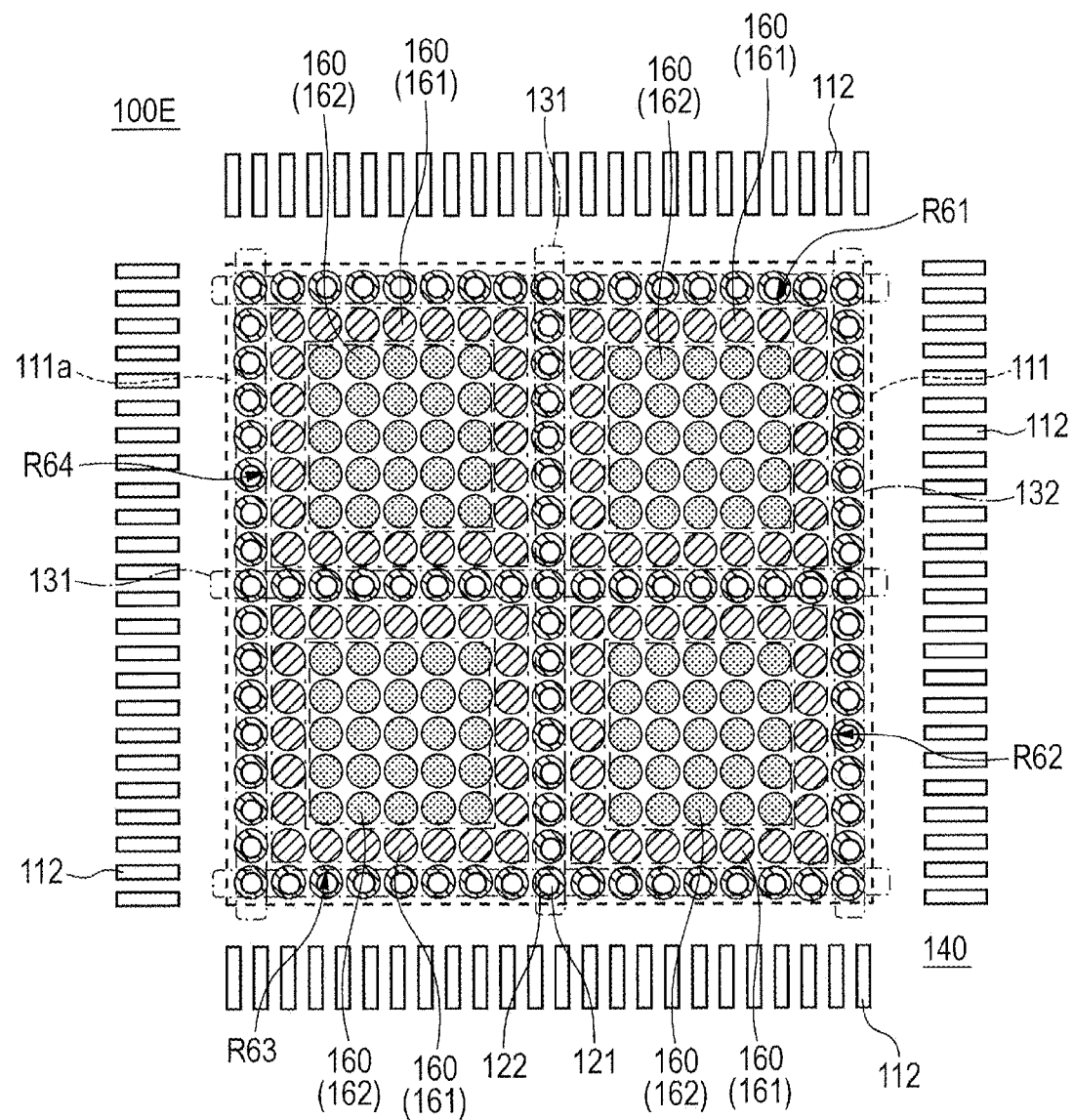
FIG. 10 is a plan view illustrating a printed wiring board according to a seventh embodiment.

Next, a printed circuit board according to a seventh embodiment of the present invention will be described below. FIG. 10 is a plan view illustrating a printed wiring board according to the seventh embodiment of the present invention. Incidentally, in the seventh embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

Also in the seventh embodiment, the electronic component is a semiconductor package of the QFP type having a similar configuration to that of the semiconductor package 200 in the above described first embodiment, but the number of leads is different from that in the first embodiment. This semiconductor package is mounted on the first surface layer of the printed wiring board 100E of the seventh embodiment.

Furthermore, in the seventh embodiment, the configurations of the through hole 121 and the connecting land 160 are similar to those in the above described first embodiment, but the arrangements are different from those in the above described first embodiment.

In the seventh embodiment, a plurality of the connecting lands 160 and a plurality of the through holes 121 are arrayed in a square lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

In the seventh embodiment, two through hole groups 131 which cross each other and a through hole group 132 which is arrayed so as to surround a plurality of the connecting lands are formed of a plurality of the through holes 121. Thus, many through holes 121 are formed, and thereby a heat dissipation effect of the heat transfer pattern 111 is enhanced.

In the seventh embodiment, the plurality (two) of the through hole groups 131 are arranged so as to cross each other (orthogonal to each other). Furthermore, each of the through hole groups 131 is arranged along a route passing through a center position of the heat transfer pattern 111. Specifically, the through hole groups 131 are arranged on respective lines which link the centers of the two opposite sides of the heat transfer pattern 111, specifically, are arranged in a +shape.

In addition, the through hole group 132 is formed of a plurality of the through holes 121 which are arrayed in a quadrangular shape, and the through holes 121 are linearly arrayed in each side. In other words, a plurality (four) of the linear through hole groups are arranged so as to cross each other (orthogonal to each other) on the circumferential part 111a, and form the through hole group 132. Thus, many through holes 121 are formed, and thereby a heat dissipation effect of the heat transfer pattern 111 is enhanced.

A solder paste is applied onto the heat transfer pattern 111 through the solder resist 140. Even when the solder is about to overflow when having been fused in a reflow step, the through holes 121 of the through hole group 132 can make the solder flow thereinto, which accordingly can suppress the spillage of the solder to the outside of the heat transfer pattern 111, specifically, can suppress the outflow of the solder to the lead-connecting lands 112.

In addition, in the seventh embodiment, the area in which a plurality of the connecting lands 160 are arranged is divided into a plurality (four) of divided areas R61, R62, R63 and R64 by the through hole groups 131 and 132. The total area of the connecting lands 160 is equal among these four divided areas R61 to R64. In the seventh embodiment, the number of the connecting lands 160 is equal in each of the divided areas R61 to R64. Thereby, the solder in each of the connecting lands 160 can support the semiconductor package with sufficient balance, and can effectively suppress the inclination of the semiconductor package.

In the seventh embodiment in particular, the connecting lands 160 are arranged so as to form lines in the square lattice form, and accordingly the solder can more effectively support the semiconductor package with sufficient balance.

In addition, the connecting lands 160 and the through holes 121 are arranged to form lines so as to be 90° rotationally symmetric with respect to the center of the heat transfer pattern 111, which can accordingly further effectively suppress the inclination of the semiconductor package.

[Eighth Embodiment]

Figure 11:
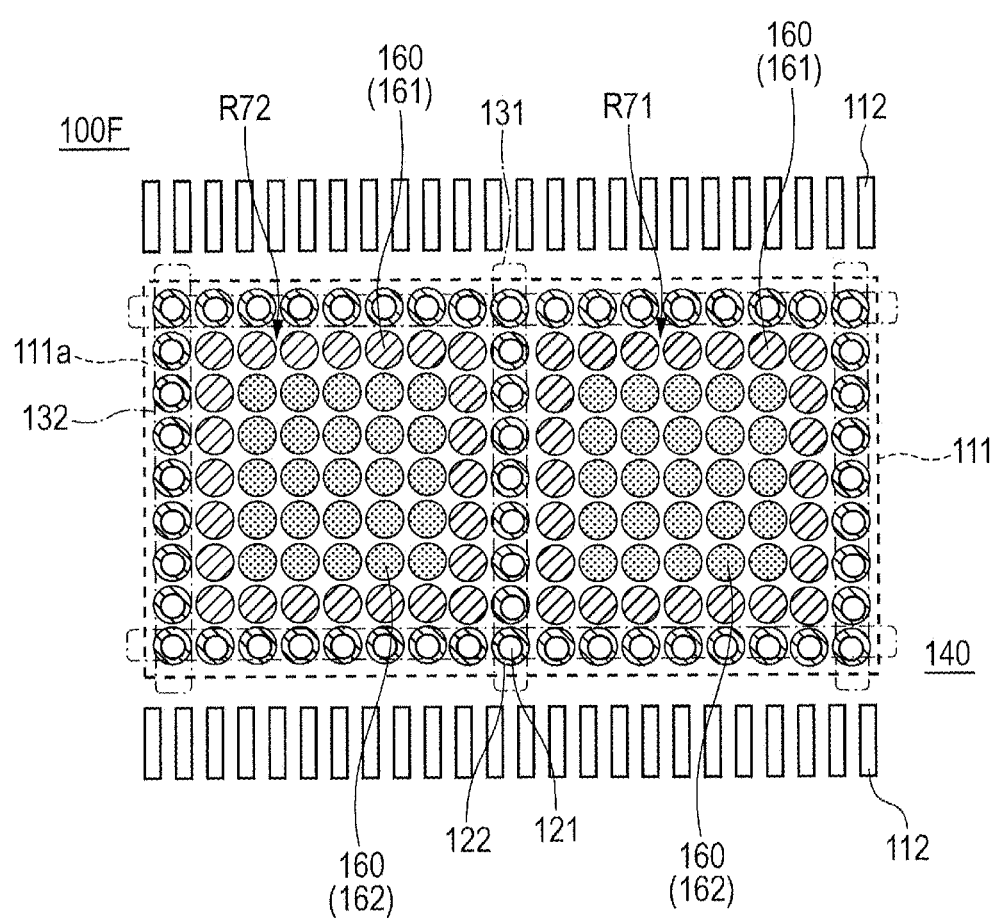
FIG. 11 is a plan view illustrating a printed wiring board according to an eighth embodiment.

Next, a printed circuit board according to an eighth embodiment of the present invention will be described below. FIG. 11 is a plan view illustrating a printed wiring board according to the eighth embodiment of the present invention. Incidentally, in the eighth embodiment, the illustration is omitted for an electronic component mounted on the printed wiring board, and a solder joint portion which connects the heat sink of the electronic component and a heat transfer pattern of the printed wiring board to each other. In addition, in the printed wiring board, configurations similar to those in the above described first embodiment are designated by the same reference numerals, and the description will be omitted.

In the eighth embodiment, the electronic component is a semiconductor package of the SOP type and is mounted on the first surface layer of the printed wiring board 100F of the eighth embodiment.

In the eighth embodiment, a plurality of the connecting lands 160 and a plurality of the through holes 121 are arrayed in a square lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the square lattice.

In the eighth embodiment, the plurality of the through holes 121 in which the through hole conductors 122 are formed are arrayed, and thereby form a through hole group 131, and also form a through hole group 132.

In the eighth embodiment, the through hole group 131 is arranged along a route passing through a center position of the heat transfer pattern 111. Specifically, the through hole group 131 is arranged on the line which links the centers of the two opposite sides of the heat transfer pattern 111.

In addition, the through hole group 132 forms a quadrangular shape, and the through holes 121 are linearly arranged in each side. In other words, a plurality (four) of the linear through hole groups are arranged so as to cross each other (orthogonal to each other) on the circumferential part 111a, and form the through hole group 132. Thus, many through holes 121 are formed, and thereby a heat dissipation effect of the heat transfer pattern 111 is enhanced.

In the eighth embodiment, the area in which a plurality of the connecting lands 160 are arranged is divided into a plurality (two) of divided areas R71 and R72 by the through hole groups 131 and 132. The total area of the connecting lands 160 is equal between these two divided areas R71 and R72. In the eighth embodiment, the number of the connecting lands 160 is equal in each of the divided areas R71 and R72. Thereby, the solder in each of the connecting lands 160 can support the semiconductor package with sufficient balance, and can effectively suppress the inclination of the semiconductor package.

In the eighth embodiment in particular, the connecting lands 160 are arranged so as to form lines in the square lattice form, and accordingly the solder can more effectively support the semiconductor package with sufficient balance.

In addition, a solder paste is applied onto the heat transfer pattern 111 through the solder resist 140. Even when the solder is about to overflow when having been fused in a reflow step, the through holes 121 of the through hole group 132 can make the solder flow thereinto, which accordingly can suppress the spillage of the solder to the outside of the heat transfer pattern 111, specifically, can suppress the outflow of the solder to the lead-connecting lands 112.

[Ninth Embodiment]

Figure 12:
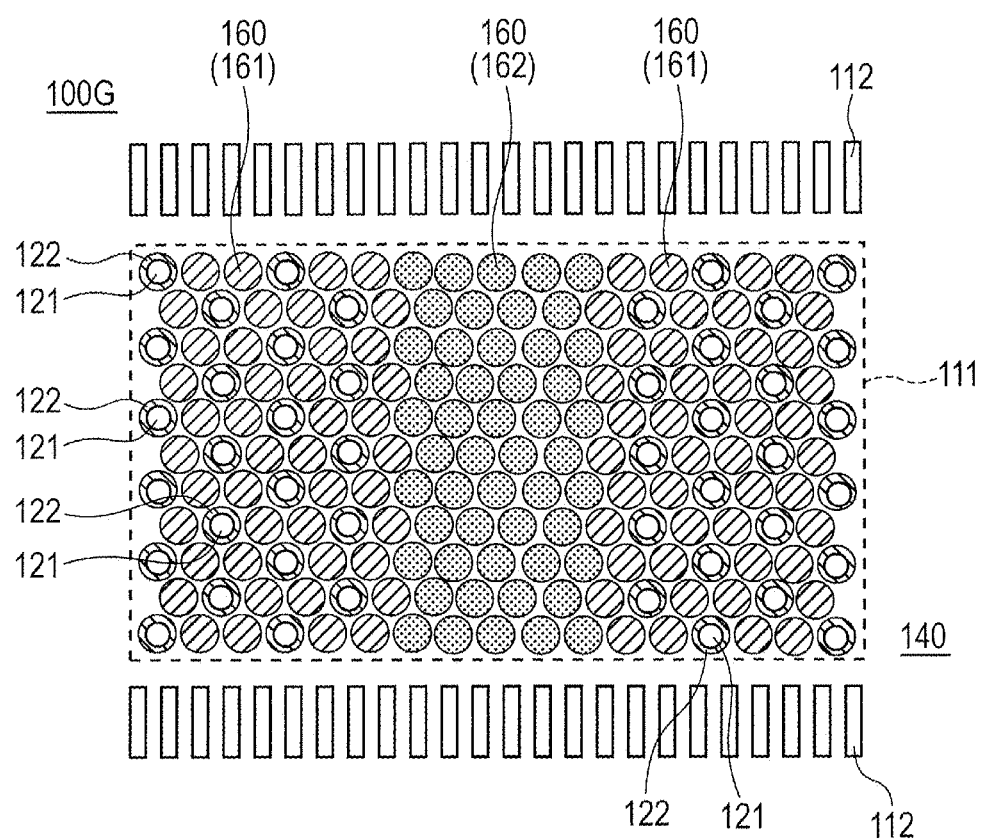
FIG. 12 is a plan view illustrating a printed wiring board according to a ninth embodiment.

Next, a printed circuit board according to a ninth embodiment of the present invention will be described below. FIG. 12 is a plan view illustrating a printed wiring board according to the ninth embodiment of the present invention. Incidentally, in the ninth embodiment, the illustration is omitted for an electronic component mounted on the printed wiring board, and a solder which connects the heat sink of the electronic component and a heat transfer pattern of the printed wiring board to each other. In addition, in the printed wiring board, configurations similar to those in the above described first embodiment are designated by the same reference numerals, and the description will be omitted.

In the ninth embodiment, the electronic component is a semiconductor package of the SOP type and is mounted on the first surface layer of the printed wiring board 100G of the ninth embodiment.

In the ninth embodiment, a plurality of the connecting lands 160 and a plurality of the through holes 121 are arrayed in a triangle lattice form on the first surface layer. Each of the connecting lands 160 is formed so as to have the same area and the same shape (circle shape) as those of the others. In other words, the connecting lands 160 and the through holes 121 are arranged to form lines so that the respective centers thereof are positioned at the lattice points of the triangle lattice. Specifically, the connecting lands 160 and the through holes 121 are arranged so as to form a staggered pattern.

By having the configuration of the ninth embodiment, the connecting lands 160 can be more densely arranged compared to those in the configuration of being arranged in the square lattice form, and the through holes 121 can be dispersively arranged. Thereby, the printing circuit board can further effectively radiate the heat.

Incidentally, the present invention is not limited to the embodiments described above, and can be variously modified within a technological idea of the present invention by those who have an ordinary knowledge in the field.

In the above described first to ninth embodiments, the case was described where the first land and the second land have circle shapes when viewed as a plane, but the shape is not limited to this shape. For instance, the first land may have such a ring shape as to surround the through holes, and the second land may have such a ring shape as to surround the through holes.

In addition, in the above described first to ninth embodiments, the case was described where there is a plurality of the through holes, but there may be at least one through hole.

In addition, the printed circuit board in the above described sixth embodiment has a configuration to which the slits 141 and 142 are added to the configuration in the above described first embodiment, but in the above described second to fifth embodiments or in the above described seventh to ninth embodiments, similarly, the first lands or the second lands may be mutually connected through the slit.

In addition, in the above described ninth embodiment, the connecting lands and the through holes were arrayed in the triangle lattice shape, in a printed wiring board on which the semiconductor package of the SOP type is mounted, but the lattice shape is not limited to this shape. The connecting lands and the through holes may be arrayed also in the triangle lattice shape, in a printed wiring board on which the semiconductor package of the QFP type is mounted.

The printed wiring board according to the present invention can enhance the heat dissipation of the electronic component while enhancing the connectability of the heat transfer pattern with the heat sink of the electronic component, when the electronic component having the heat sink is mounted thereon.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-279564, filed Dec. 21, 2012, and No. 2013-149064, filed Jul. 18, 2013, which are hereby incorporated by reference herein in their entirety.

What is claimed is:

1. A printed circuit board comprising
a printed wiring board, wherein the printed wiring board comprises a first surface layer on which an electronic component is mounted, wherein a heat transfer pattern is formed in an area of the first surface on which the electronic component is mounted, a second surface layer positioned on a side of the printed wiring board, opposite to the first surface layer, wherein a first conductive pattern is formed in an area of the second surface, and a through hole penetrating the printed wiring board in a thickness direction thereof, wherein the through hole is formed in the area in which the heat transfer pattern is formed, a through hole conductor is formed within the through hole, and the through hole conductor is thermally connected to the heat transfer pattern and the first conductive pattern;
an electronic component having a heat sink mounted on the first surface layer of the printed wiring board; and
a solder joint portion arranged between the heat sink of the electronic component and the heat transfer pattern of the printed wiring board, wherein
the heat transfer pattern is covered with a solder resist, and is exposed from the solder resist to form a plurality of connecting lands, wherein
the plurality of connecting lands comprises a first land group including a plurality of first lands, and a second land group including a plurality of second lands, each of the first lands is arranged adjacent to the through hole, and the each of the second lands is not arranged adjacent to the through hole, and wherein
at least one of the first lands is not connected through the solder joint portion to the heat sink, the second lands are connected through the solder joint portion to the heat sink, the solder is solidified within the at least one of the through holes.

2. The printed circuit board according to claim 1, wherein the printed wiring board has at least one inner layer including a second conductive pattern arranged between the first and second surface layers, connected to the through hole.

3. The printed circuit board according to claim 1, wherein the electronic component is a semiconductor package of QFP type or SOP type.

4. A printed circuit board comprising a printed wiring board, wherein the printed wiring board comprises a first surface layer on which an electronic component is mounted, wherein a heat transfer pattern is formed in an area of the first surface on which the electronic component is mounted, a second surface layer positioned on a side of the printed wiring board, opposite to the first surface layer, wherein a first conductive pattern is formed in an area of the second surface, and a through hole penetrating the printed wiring board in a thickness direction thereof, wherein the through hole is formed in the area in which the heat transfer pattern is formed, a through hole conductor is formed within the through hole, and the through hole conductor is thermally connected to the heat transfer pattern and the first conductive pattern; an electronic component having a heat sink mounted on the first surface layer of the printed wiring board; and a solder joint portion arranged between the heat sink of the electronic component and the heat transfer pattern of the printed wiring board, wherein the heat transfer pattern is covered with a solder resist, and is exposed from the solder resist to form a plurality of connecting lands, wherein the plurality of connecting lands comprise a first land group including a plurality of first lands, and a second land group including a plurality of second lands, each of the first lands is arranged adjacent to the through hole, and the each of the second lands is not arranged adjacent to the through hole; wherein the printed wiring board has at least one inner layer including a second conductive pattern arranged between the first and second surface layers, connected to the through hole.

5. The printed circuit board according to claim 4, wherein
a plurality of the through holes, in each of which the through hole conductor is arranged, are provided,
each of the first lands is adjacent to at least one of the plurality of the through holes, and
none of the second lands is adjacent to any one of the plurality of the through holes.

6. The printed circuit board according to claim 5, wherein at least a part of the plurality of the through holes is arranged to surround the plurality of connecting lands.

7. The printed circuit board according to claim 5, wherein the plurality of the through holes are arranged along a route passing a center position of the heat transfer pattern.

8. The printed circuit board according to claim 5, wherein the plurality of the though holes are arranged so as to make at least two routes which cross each other.

9. The printed circuit board according to claim 4, wherein a ratio of an area of the second land to an area of lattice in which the second land is arranged is set at 30% or more and 63% or less.

10. The printed circuit board according to claim 4, wherein
adjacent ones of the plurality of second lands are mutually connected, at the first surface layer, through a slit at which the heat transfer pattern is exposed from the solder resist.

11. The printed circuit board according to claim 4, wherein
the plurality of connecting lands and the through hole are arranged in a square lattice at the first surface layer.

12. The printed circuit board according to claim 4, wherein
the plurality of connecting lands and the through hole are arranged in a triangle lattice at the first surface layer.

13. A printed circuit board comprising a printed wiring board, wherein the printed wiring board comprises a first surface layer on which an electronic component is mounted, wherein a heat transfer pattern is formed in an area of the first surface on which the electronic component is mounted, a second surface layer positioned on a side of the printed wiring board, opposite to the first surface layer, wherein a first conductive pattern is formed in an area of the second surface, and a through hole penetrating the printed wiring board in a thickness direction thereof, wherein the through hole is formed in the area in which the heat transfer pattern is formed, a through hole conductor is formed within the through hole, and the through hole conductor is thermally connected to the heat transfer pattern and the first conductive pattern; an electronic component having a heat sink mounted on the first surface layer of the printed wiring board; and a solder joint portion arranged between the heat sink of the electronic component and the heat transfer pattern of the printed wiring board, wherein the heat transfer pattern is covered with a solder resist, and is exposed from the solder resist to form a plurality of connecting lands, wherein the plurality of connecting lands comprise a first land group including a plurality of first lands, and a second land group including a plurality of second lands, each of the first lands is arranged adjacent to the through hole, and the each of the second lands is arranged distant from the through hole rather than the first lands; wherein the printed wiring board has at least one inner layer including a second conductive pattern arranged between the first and second surface layers, connected to the through hole.

14. The printed circuit board according to claim 13, wherein
a distance from the first land to a through hole adjacent to the first land is equal to or smaller than 0.20 mm, and a distance from the through hole adjacent to the first land to the second land is equal to or larger than 0.25 mm.

15. The printed circuit board according to claim 13, wherein
a plurality of the through holes, in each of which the through hole conductor is arranged, are provided,
each of the first lands is adjacent to at least one of the plurality of the through holes, and
each of the second lands is arranged distant from the through hole rather than the first lands.

16. The printed circuit board according to claim 13, wherein
a ratio of an area of the second land to an area of lattice in which the second land is arranged is set at 30% or more and 63% or less.

17. The printed circuit board according to claim 13, wherein
adjacent ones of the plurality of second lands are mutually connected, at the first surface layer, through a slit at which the heat transfer pattern is exposed from the solder resist.

18. An electronic device provided with the printed circuit board according to claim 4.

* * * * *